United States Patent
Doescher

(10) Patent No.: US 6,630,822 B2
(45) Date of Patent: Oct. 7, 2003

(54) MR ANGLE SENSOR

(75) Inventor: Michael Doescher, Hamburg (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 2 days.

(21) Appl. No.: 09/817,109

(22) Filed: Mar. 26, 2001

(65) Prior Publication Data

US 2001/0030540 A1 Oct. 18, 2001

(30) Foreign Application Priority Data

Mar. 27, 2000 (DE) .......................... 100 14 779

(51) Int. Cl.⁷ .............................. G01B 7/30; G01R 33/02
(52) U.S. Cl. ................................. 324/207.21; 324/252
(58) Field of Search ........................... 324/252, 235, 324/207.21; 428/692; 360/313, 325, 328, 327.3; 338/32 R

(56) References Cited

U.S. PATENT DOCUMENTS

| | | | | |
|---|---|---|---|---|
| 4,847,584 A | * | 7/1989 | Pant | 338/32 R |
| 5,247,278 A | * | 9/1993 | Pant et al. | 338/32 R |
| 5,602,471 A | * | 2/1997 | Muth et al. | 324/207.21 |
| 5,684,397 A | * | 11/1997 | Ishishita | 324/252 |
| 5,820,924 A | * | 10/1998 | Witcraft et al. | 427/130 |
| 6,222,361 B1 | * | 4/2001 | Shimano et al. | 324/207.21 |

* cited by examiner

*Primary Examiner*—John Barlow
*Assistant Examiner*—Toan M Le
(74) *Attorney, Agent, or Firm*—Steven R. Biren

(57) ABSTRACT

Magnetoresistive sensors for angle measurements utilizing the effect that a sufficiently strong, external magnetic field H rotates the internal magnetization M in a parallel direction. The magnetic field strength required for full alignment of the internal magnetization is 70 to 100 kA/m.

A reduction of this high field strength is desirable and may be achieved by increasing the tendency of the internal magnetization to change its direction. An increase of the tendency of the internal magnetization to change its alignment is achieved in accordance with the invention by strip-shaped sensor elements of NiFe material having elliptical contours.

A reduction of the magnetic field strength required for a saturation, from 20 to 30 kA/m is thereby possible.

11 Claims, 4 Drawing Sheets

Circular NiFe Structure

MR ANGLE SENSOR

The invention relates to magnetoresistive sensors for angle measurements. A preferred field of application of magnetoresistive sensors is their use for contactless angle measurement.

Magnetoresistive sensors for angle measurements such as, for example, the sensors of the type KMZ 41, manufactured and marketed by Philips Semiconductors, are principally known and utilize the magnetoresistive effect. A preferred use of MR sensors is in the weak field, angle and rotation measurements and in Magnetic Force Microscopy measurements (abbreviated MFM measurements; for example, on crystals of the product marketed as KMZB34 by Philips Semiconductors).

Magnetoresistive sensors (also abbreviated to and known as MR sensors) for angle measurements operate in the saturation range, i.e. they utilize the effect that a sufficiently strong external magnetic field H rotates an internal magnetization M of the sensor elements in the arrangement of the magnetoresistive sensor in a (substantially) fully parallel direction. In the case of said sensor KMZ 41, the magnetic field strength of the external magnetic field required for full alignment of the internal magnetization is 70 to 100 kA/m. The generation of such a strong magnetic field requires a relatively high number of constructive components. A reduction of this high field strength is desirable.

It is an object of the invention to achieve a decrease of the magnetic field strength required for saturation (parallel setting).

This object is solved by a magnetic field-sensitive sensor arrangement comprising at least a sensor element of NiFe material arranged substantially in a plane and being substantially strip-shaped in this plane, which sensor element has a contour in this plane which comprises substantially a central area with mutually parallel boundary lines, and, at least at one of the ends of the central area, an end segment which is at least substantially bounded by elliptical curves and/or is tapered towards the end.

Advantageous embodiments of the invention are defined in the dependent claims.

The magnetic field-sensitive sensor arrangement according to the invention is thus distinguished by shape-optimized, strip-shaped thin layers of a magneto-resistive material, preferably permalloy or NiFe 81:19.

The desirable decrease of said high field strengths can be achieved by increasing the tendency of the internal magnetization to change its direction. An increase of the tendency of the internal magnetization to change its alignment is achieved, according to the invention, by strip-shaped sensor elements of NiFe material having elliptical contours or tapered ends.

The rotatability of the magnetization is enhanced in the magnetic field-sensitive sensor arrangement according to the invention by giving the MR sensor elements a suitable shape.

A circular MR structure provides the principally easiest rotatability of the magnetization. It is therefore obvious to realize the sensor elements also in a circular shape. However, this has the drawback that—conditioned by manufacturing spreads (mask adjustment in photolithography, etc.)—such circular structures can only be contacted incompletely, i.e. with high tolerances, and, moreover, require a large surface area.

The invention is based on the recognition that MR structures utilizing elliptical and circular geometries in a defined way have a far better rotatability of the magnetization than the typically used rectangular structures. In this respect it is important that elliptical structures with pointed corners have a very weak domain splitting. By combination with rectangular parts of the MR strips, these structures can nevertheless be manufactured in a satisfactorily reproducible way while maintaining typical manufacturing tolerances.

The invention has the advantage of a reduction, which is comparably easy to realize, of the required saturation field strength to 20–30 kA/m at a small angle error by shape anisotropy. The reduction of the saturation field strength is supported by using very thin layers, while the reduction of the shape anisotropy is achieved by the shape optimization of the strips according to the invention.

These and other aspects of the invention are apparent from and will be elucidated with reference to the embodiments described hereinafter.

In the drawings:

FIG. 1 shows diagrammatically a magnetic field-sensitive sensor arrangement with a plurality of sensor elements of NiFe material which are arranged substantially in a plane and are substantially strip-shaped in this plane, which elements constitute a strip-shaped meandering NiFe structure in which the separate sensor elements are interconnected by NiFe strip terminations. WTi—Al short-circuits additionally connect the ends of the sensor elements in the form of a meander and the overall arrangement has external contacts by means of WTi—Al leads.

FIG. 2 shows diagrammatically a first embodiment of a sensor element according to the invention. In this embodiment, all NiFe strips are constituted by the combination of two basic shapes: a rectangular strip and an NiFe termination. All combinations of "NiFe termination" of a rectangular strip and "NiFe short-circuit" are possible in accordance with the invention.

In this "peak" NiFe termination, the length of the peak l is an n-fold value, $n \in \Re$, of the strip width b. There is at least substantially no curvature of the lateral contours of the end segments.

In the NiFe termination shown in FIG. 3, the length of the peak l is an m-fold value, $m \in \Re$, of the strip width b. The curvature of the "arrow head" corresponds to the cut-set of one or two ellipses.

In the case of only one ellipse, the entire termination is elliptical, which has, however, the drawback of domain splitting at the peak.

In the case of the cut-set of two ellipses, their dimension should be identical. The length of their short semi-axis is the g-fold value, with $g \in \Re$ of the strip width b (g>b) in which each ellipse conforms to one side of the strip.

The length of the long semi-axis is the h-fold value, with $h \in \Re$ of the strip width b (h>b), in which the distance x between the vortex of the ellipse and the end of the rectangular strip part must not become negative.

For the purpose of comparison, FIG. 4 shows the arrangement of the NiFe structures in the magnetic field-sensitive sensor arrangement which is commercially available as type KMZ 51.

FIG. 5 shows a first embodiment of an NiFe short-circuit according to the invention. A simple short-circuit strip aligned substantially perpendicularly to the longitudinal extension of the substantially strip-shaped sensor elements overlaps the sensor elements sufficiently far at each strip side so as to compensate adjusting and structuring tolerances. The same applies to the distance to the beginning of a peak. The width of the short-circuit strip j is smaller than or equal to the NiFe strip width b.

Any non-magnetizable or magnetically active material or any comparable material combination such as, for example, alu on WTi may be used as a material for the short-circuit strip.

FIG. 6 shows a modification of an NiFe short circuit according to the invention with a short-circuit strip which is distinguished in that a contact metal connection represents a small-area (circular or rectangular) contact with the first NiFe structure and subsequently extends—separated by an insulation layer of NiFe—to the second NiFe structure so as to contact this structure also on a small area. Fluctuations of the sensor resistance, conditioned by adjusting tolerances in the manufacturing process, are thus reduced.

Any non-magnetizable or magnetically active material or a corresponding material combination, for example alu on WTi may be used as a material for the short-circuit strip.

FIG. 7 shows a further embodiment of an NiFe short-circuit according to the invention. It comprises a superposed NiFe circle whose center is located exactly between two adjacent strips and whose diameter is defined by the fact that the current density in the short circuit does not exceed $10^7$ $A/cm^2$. The width of the strips and the diameter are preferably dimensioned substantially identically. Instead of a circle, ellipses of any ratio from the short to the long semi-axis may be used.

FIG. 8 shows a further embodiment of an NiFe short circuit according to the invention which, in accordance with its contour, is also denoted as NiFe short circuit "gothic". The connection of the NiFe strips is defined by the inserted areas of four ellipses conforming to adjacent NiFe strips on the inner and outer side, i.e. the curvature of the "gothic peak" is described by these four ellipses. These ellipses are combined to two pairs of ellipses, with two ellipses forming the outer side of the "gothic peak" (first pair of ellipses) and two further ellipses constitute the inner side of the "gothic peak" (second pair of ellipses). The dimensions of the ellipses of a pair of ellipses are identical. It holds for the outer pair of ellipses that the length of their short semi-axis is the g-fold value of the strip width b, with each ellipse conforming to one side of the strip and g being a number larger than 1. The length of the long semi-axis of the outer pair of ellipses is the h-fold value of the strip width b, in which h is a number larger than 1 and the distance x between the vortex of the ellipse and the end of the rectangular strip part does not become negative. The same holds for the inner pair of ellipses, except that g and h may also be smaller than 1. Thus, the connection of the adjacent NiFe strips is constituted by a single arc of a circle as a special case of the "gothic peak". The presence of a sharp "gothic peak" leads of course to a smaller domain splitting and is therefore preferable.

NiFe structures are described hereinafter, which are constituted by the combination of a circular basic shape and an arbitrary NiFe short circuit, as described hereinbefore. A preferred embodiment is the combination with an NiFe short circuit as shown in FIG. 6.

Figure 1:
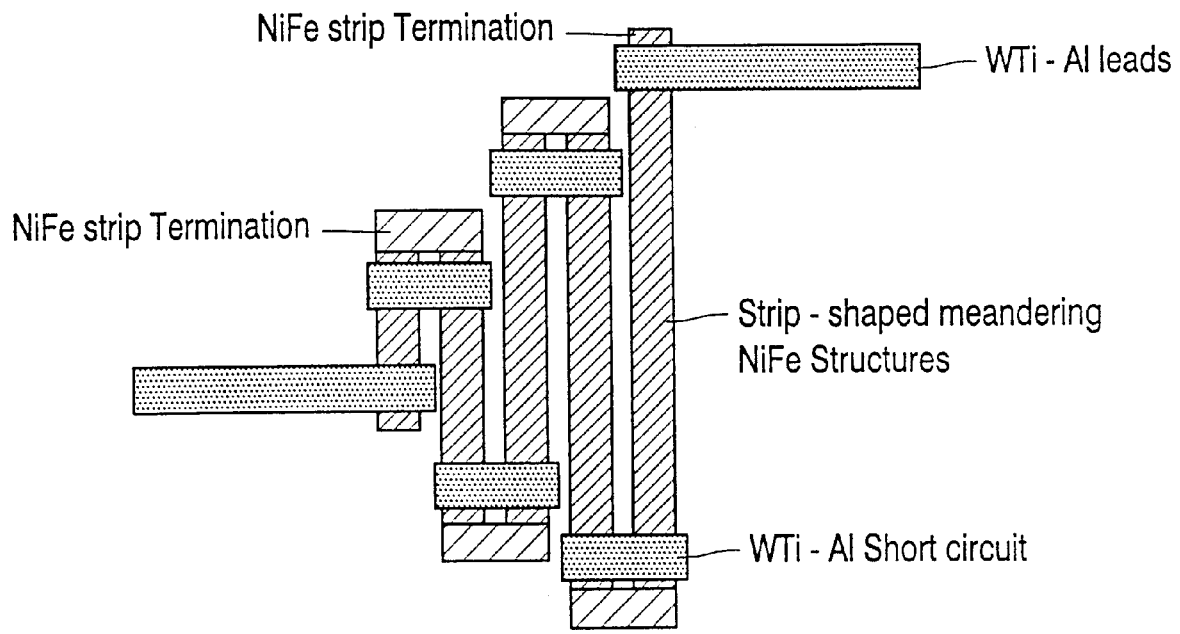
Figure 2:
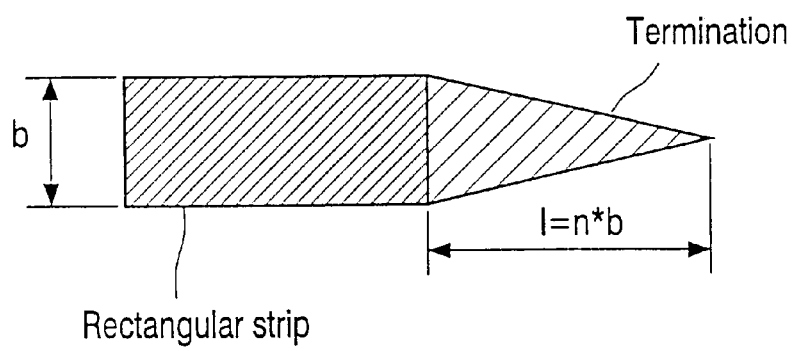
Figure 3:
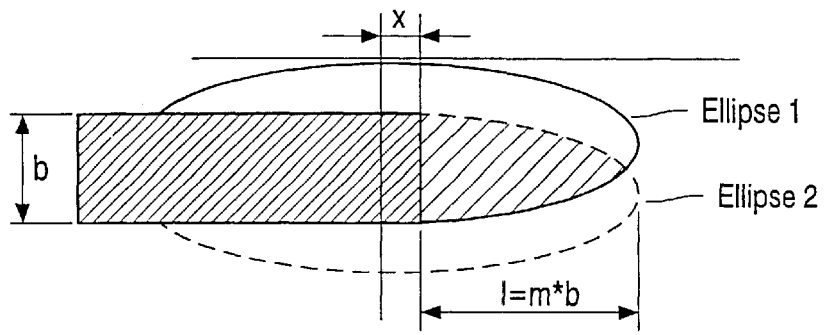
Figure 4:
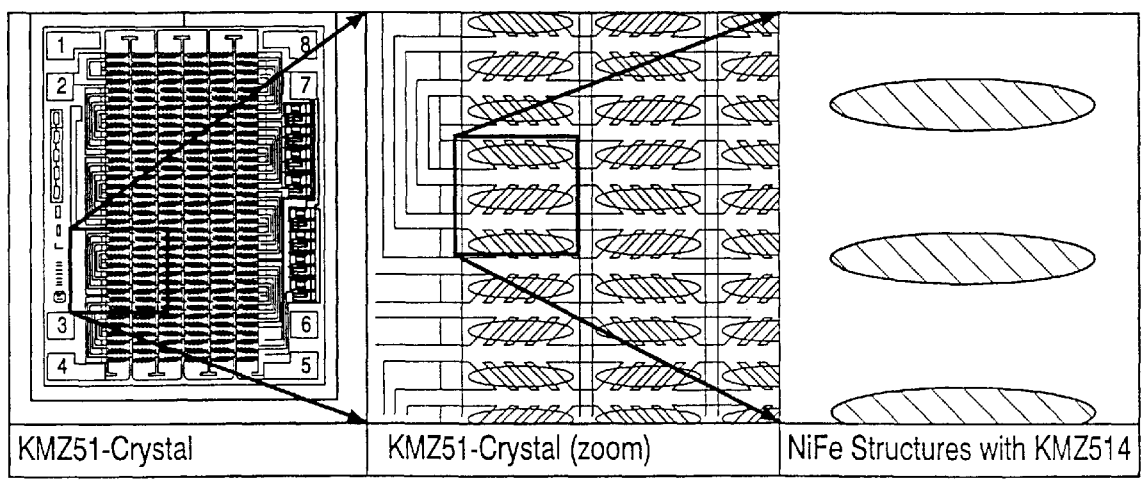
Figure 5:
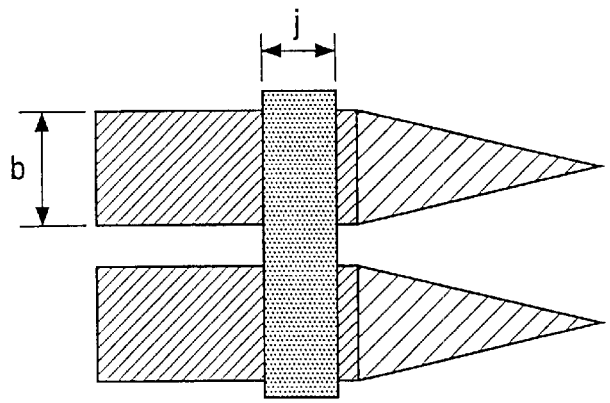
Figure 6:
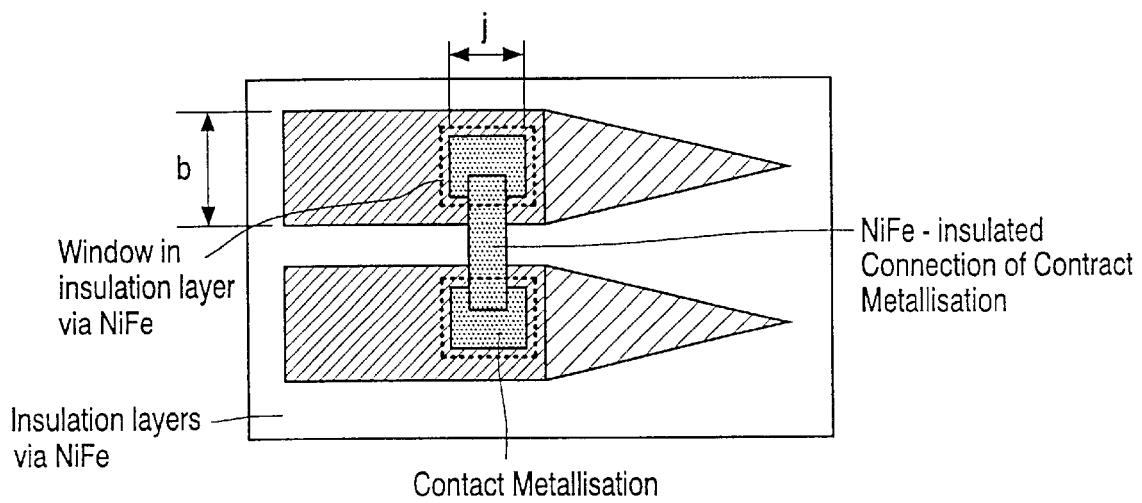
Figure 7:
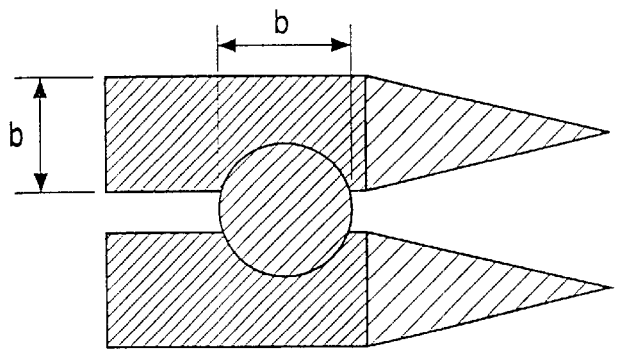
Figure 8:
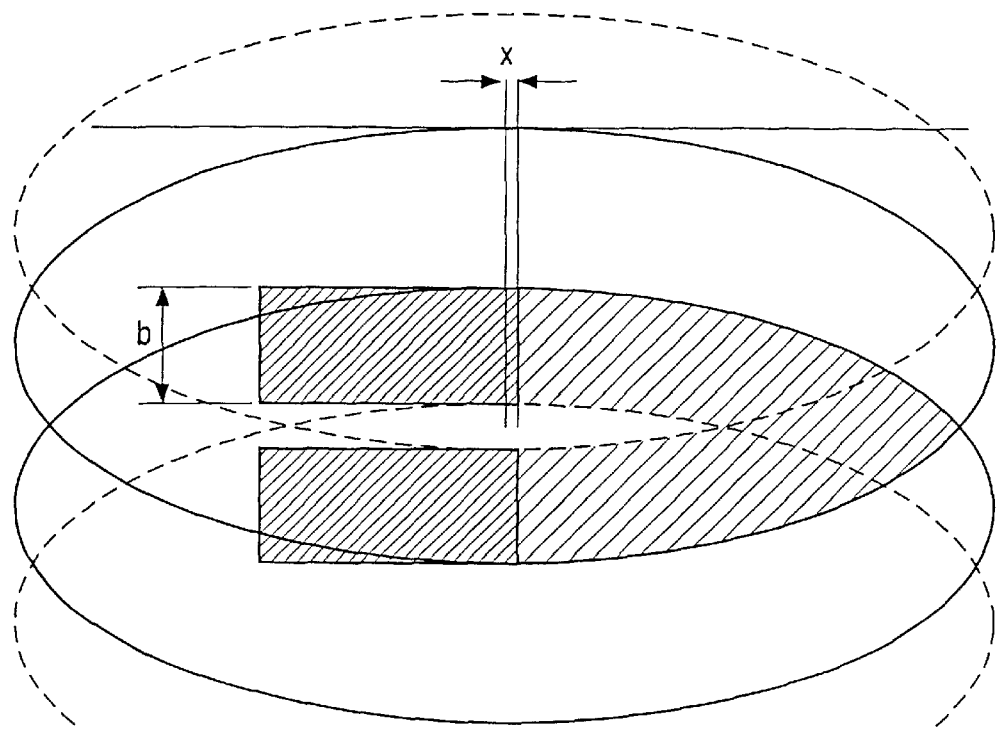
Figure 9:
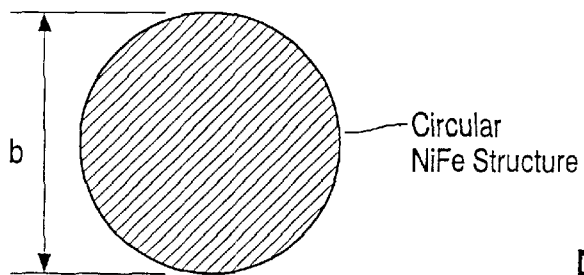
FIG. 9 shows an NiFe structure in the form of a circle with diameter b.
Figure 10:
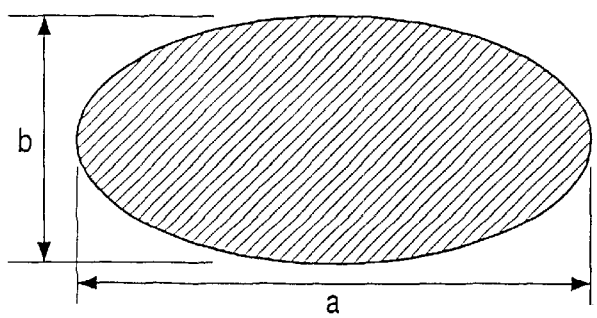
FIG. 10 shows an elliptical NiFe structure with a length of the semi-axes of a/2 and b/2, in which a>b and a, b∈ℜ. This NiFe structure is usable preferably in connection with an NiFe termination as shown in FIGS. 2 and 3.

What is claim is:

1. A magnetic field-sensitive sensor arrangement comprising at least a sensor element of NiFe material arranged substantially in a plane and being substantially strip-shaped in this plane, which sensor element has a substantially central area with mutually parallel boundary lines, and, at least at one of the ends of the central area, an end segment which is at least substantially bounded by elliptical curves towards the end.

2. A magnetic field-sensitive sensor arrangement as claimed in claim 1, characterized in that the length of the end segments, measured in the direction of the longitudinal extension of the substantially strip-shaped elements, is chosen to be a predetermined multiple of the width of the substantially strip-shaped sensor elements, measured substantially perpendicularly to the direction of the longitudinal extension of the substantially strip-shaped sensor elements.

3. A magnetic field-sensitive sensor arrangement as claimed in claim 2, characterized in that at least one of the end segments is bounded by a continuous elliptical curve whose short semi-axis is aligned substantially perpendicularly to the longitudinal extension of the substantially strip-shaped sensor elements, and whose long semi-axis is aligned substantially in the direction of the longitudinal extension of the substantially strip-shaped sensor elements and is at least as long as the length of the end segments.

4. A magnetic field-sensitive sensor arrangement as claimed in claim 1, comprising at least two substantially strip-shaped sensor elements, characterized in that the substantially strip-shaped sensor elements are arranged at least substantially parallel to each other.

5. A magnetic field-sensitive sensor arrangement as claimed in claim 4, characterized in that the sensor elements are arranged spatially close together.

6. A magnetic field-sensitive sensor arrangement as claimed in claim 4, characterized by a meander-like connection of the sensor elements, such that the respective adjacent ends of two respective adjacent sensor elements are connected by means of electrically conducting connection elements.

7. A magnetic field-sensitive sensor arrangement as claimed in claim 4, characterized in that the connection element or connection elements is (are) constituted by (a) short-circuit strip(s) aligned substantially perpendicular to the longitudinal extension of the substantially strip-shaped sensor elements.

8. A magnetic field-sensitive sensor arrangement as claimed in claim 7, characterized in that the connection element or connection elements is (are) in conducting contact with the strip-shaped sensor elements exclusively within an insulating layer window whose position on the strip-shaped sensor element is defined and which is formed in an electrically insulating layer provided on the strip-shaped sensor elements.

9. A magnetic field-sensitive sensor arrangement as claimed in claim 4, characterized in that the connection element or connection elements is (are) constituted by (a) substantially circular short-circuit element(s) whose center (s) is (are) arranged between the sensor elements to be connected.

10. A magnetic field-sensitive sensor arrangement, comprising a plurality of strip-shaped structures, wherein each strip-shaped structure includes a central area formed by parallel boundary lines and at least one end segment formed by an intersection of a first ellipse with a second ellipse.

11. A magnetic field-sensitive sensor arrangement, comprising:
 a first strip-shaped structure;
 a second strip-shaped structure located parallel to the first structure;
 wherein the first strip-shaped structure is electrically attached to the second strip-shaped structure by an end segment extending from the first strip-shaped structure and the second strip-shaped structure; and
 wherein the end segment is formed by the intersection of a first pair of ellipses forming an outer edge, and the intersection of a second pair of ellipses forming an inner edge.

* * * * *